US012571104B2

(12) United States Patent　　(10) Patent No.:　US 12,571,104 B2
Gomi et al.　　　　　　　　　　　　(45) Date of Patent:　Mar. 10, 2026

(54) SOURCE GAS SUPPLY METHOD, SOURCE GAS SUPPLY MECHANISM, AND FILM FORMING SYSTEM

(71) Applicant: TOKYO ELECTRON LIMITED, Tokyo (JP)

(72) Inventors: Tomoyuki Gomi, Yamanashi (JP); Masayuki Moroi, Yamanashi (JP); Yuichi Furuya, Yamanashi (JP); Kohichi Satoh, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 377 days.

(21) Appl. No.: 17/991,316

(22) Filed: Nov. 21, 2022

(65) Prior Publication Data

US 2023/0167555 A1　　Jun. 1, 2023

(30) Foreign Application Priority Data

Nov. 29, 2021　(JP) ................................ 2021-192993

(51) Int. Cl.
*C23C 16/52*　　(2006.01)
*C23C 16/16*　　(2006.01)
*C23C 16/44*　　(2006.01)
*C23C 16/448*　　(2006.01)

(52) U.S. Cl.
CPC .............. *C23C 16/52* (2013.01); *C23C 16/16* (2013.01); *C23C 16/4408* (2013.01); *C23C 16/4481* (2013.01)

(58) Field of Classification Search
CPC . C23C 16/4408; C23C 16/4481; C23C 16/52; C23C 16/16; C23C 16/45561
See application file for complete search history.

(56) References Cited

U.S. PATENT DOCUMENTS

| | | | | |
|---|---|---|---|---|
| 2012/0228771 A1* | 9/2012 | Edelstein | ................ | C23C 16/44 |
| | | | | 438/653 |
| 2018/0211850 A1 | 7/2018 | Kondoh | | |
| 2021/0054503 A1* | 2/2021 | Araki | ...................... | C23C 16/52 |
| 2022/0010430 A1 | 1/2022 | Hayashi et al. | | |

FOREIGN PATENT DOCUMENTS

| | | |
|---|---|---|
| JP | 2011-513950 A | 4/2011 |
| JP | 2016-151025 A | 8/2016 |
| JP | 2017-028110 A | 2/2017 |
| KR | 10-2021-0023715 A | 3/2021 |
| KR | 10-2021-0088719 A | 7/2021 |
| WO | WO 2009/105376 A2 | 8/2009 |

* cited by examiner

*Primary Examiner* — Joseph A Miller, Jr.
(74) *Attorney, Agent, or Firm* — Fenwick & West LLP

(57) ABSTRACT

A source gas supply method for supplying a source gas to a processing part through a line by a carrier gas is provided. The source gas is generated by vaporizing a film forming source by heating a source container in which the film forming source is stored and a filling gas is filled. The method comprises replacing the filling gas in the source container with a replacement gas that does not deteriorate the source gas, determining whether or not the replacement with the replacement gas has been performed by measuring a pressure in the line using a pressure gauge, and heating the source container and supplying the source gas when it is determined that the replacement with the replacement gas has been performed.

17 Claims, 6 Drawing Sheets

SLOW EXHAUST

FAST EXHAUST

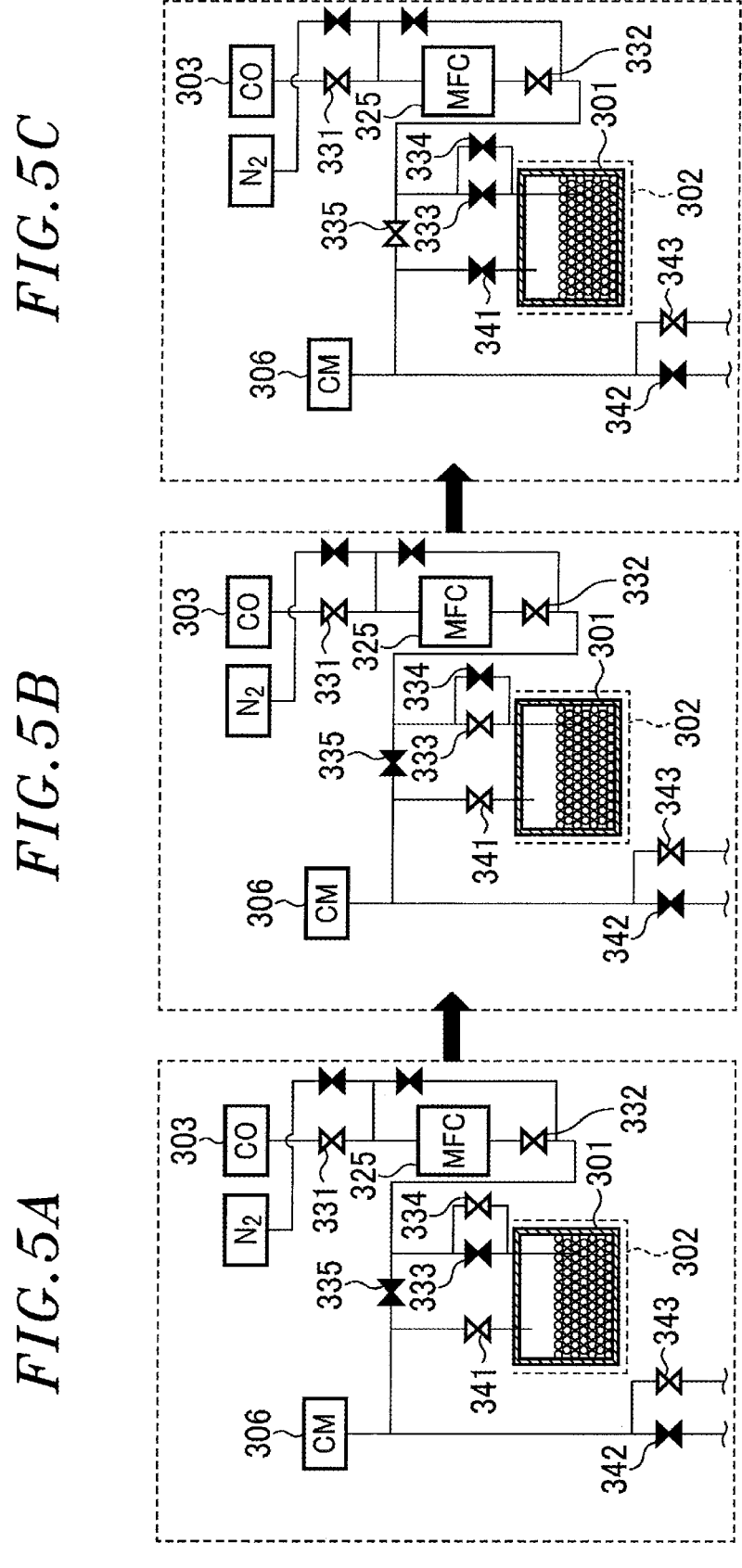
*FIG.5A*     *FIG.5B*     *FIG.5C*

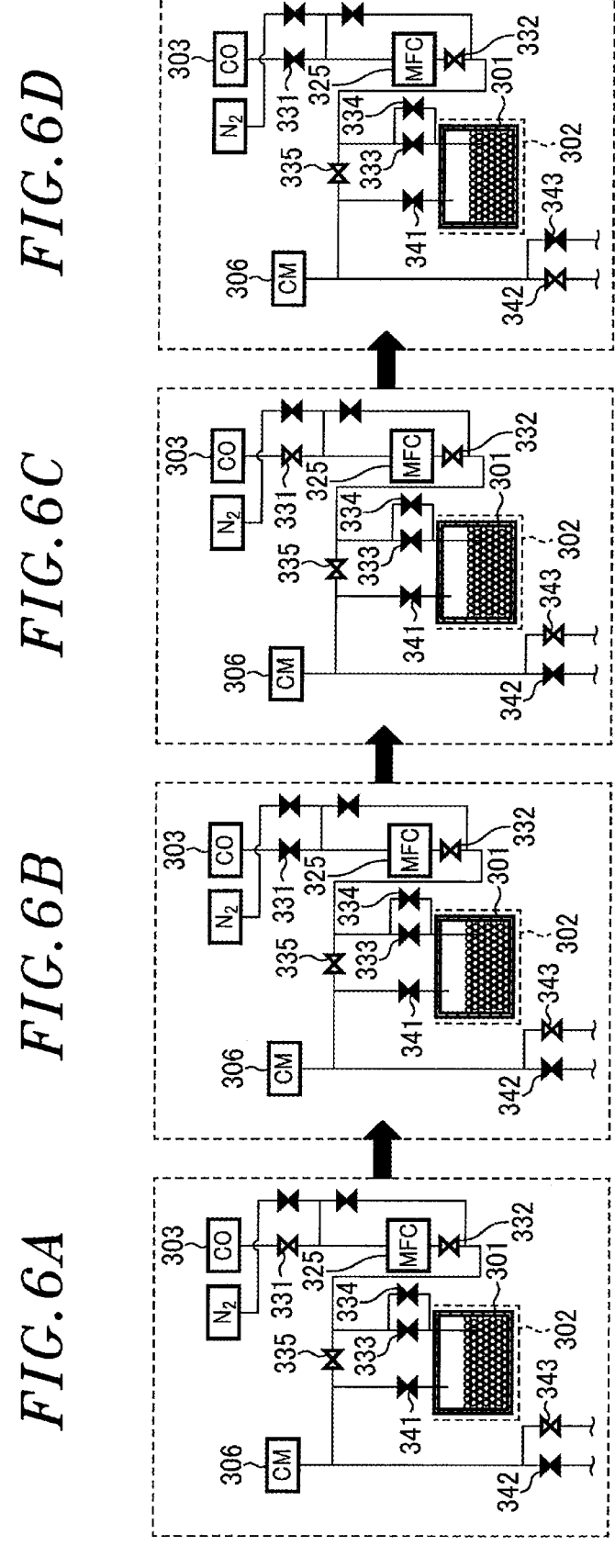
*FIG.6A*　*FIG.6B*　*FIG.6C*　*FIG.6D*

SOURCE GAS SUPPLY METHOD, SOURCE GAS SUPPLY MECHANISM, AND FILM FORMING SYSTEM

CROSS-REFERENCE TO RELATED APPLICATIONS

This application claims priority to Japanese Patent Application No. 2021-192993 filed on Nov. 29, 2021, the entire contents of which are incorporated herein by reference.

TECHNICAL FIELD

The present disclosure relates to a source gas supply method, a source gas supply mechanism, and a film forming system.

BACKGROUND

Japanese Laid-open Patent Publication No. 2016-151025 discloses a technique for heating a container containing ruthenium carbonyl that is a ruthenium source, transferring a sublimated ruthenium carbonyl gas to a processing container by a CO gas as a carrier gas, and forming a ruthenium film on a substrate in the processing container by CVD.

SUMMARY

The present disclosure provides a technique capable of suppressing deterioration of a film forming source in a source container in the case of supplying a source gas that is vaporized by heating the film forming source contained in the source container.

One aspect of the present disclosure provides a source gas supply method for supplying a source gas to a processing part through a line by a carrier gas, the source gas being generated by vaporizing a film forming source by heating a source container in which the film forming source is stored and a filling gas is filled, the method comprising: replacing the filling gas in the source container with a replacement gas that does not deteriorate the source gas; determining whether or not the replacement with the replacement gas has been performed by measuring a pressure in the line using a pressure gauge; and heating the source container and supplying the source gas when it is determined that the replacement with the replacement gas has been performed.

BRIEF DESCRIPTION OF THE DRAWINGS

The objects and features of the present disclosure will become apparent from the following description of embodiments, given in conjunction with the accompanying drawings, in which:

FIGS. 5A to 5C explain a valve abnormality detection sequence in step ST2 of the source gas supply method shown in FIG. 3; and FIGS. 6A to 6D explain a sequence of detecting abnormality of an exhaust-side valve disposed on a processing part side that is an exhaust side.

DETAILED DESCRIPTION

Hereinafter, embodiments will be described with reference to the accompanying drawings.

<Film Forming System>

Figure 1:
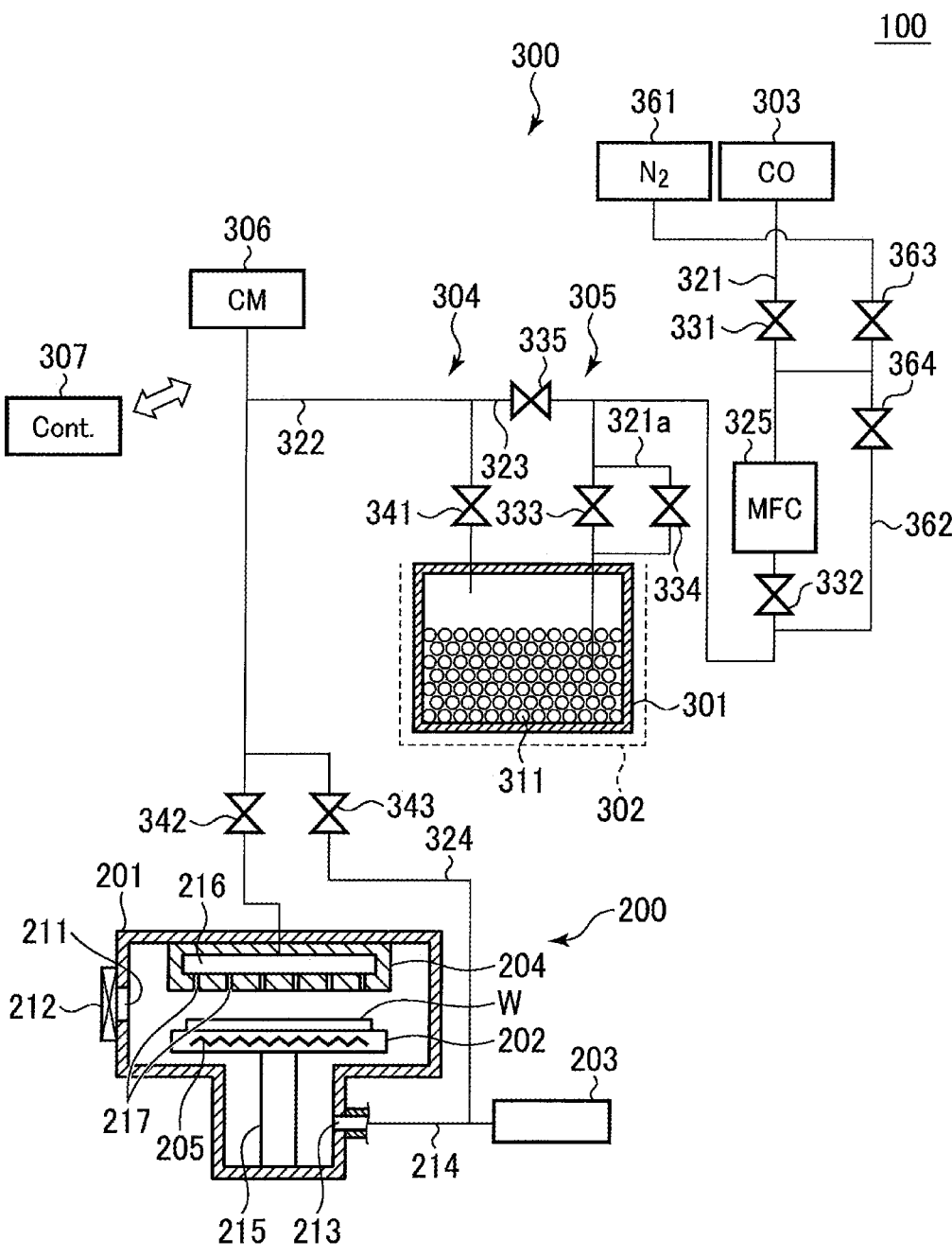
FIG. 1 schematically shows a film forming system including a source gas supply mechanism according to one embodiment.

FIG. 1 schematically shows a film forming system including a source gas supply mechanism according to one embodiment.

The film forming system 100 includes a processing part 200 for forming a ruthenium film on a substrate by CVD, and a source gas supply mechanism 300 for supplying a ruthenium source gas to the processing part 200.

The processing part 200 includes a processing chamber 201, a substrate support 202, an exhaust device 203, a shower head 204, and a heating mechanism 205.

The processing chamber 201 has an inner space that can be maintained in a vacuum atmosphere, and is used to form a ruthenium film on a substrate W. A loading/unloading port 211 for loading/unloading the substrate W is formed on a side surface of the processing chamber 201, and is opened and closed by a gate valve 212. An exhaust port 213 is disposed at a bottom portion of the processing chamber 201.

The substrate support 202 is disposed horizontally in the processing chamber 201, and the substrate W is placed thereon. The substrate support 202 is supported by a support member 215 extending from the bottom portion of the processing chamber 201.

The exhaust device 203 includes a vacuum pump or a pressure control valve, and evacuates the processing chamber 201 through an exhaust line 214 connected to an exhaust port 213.

The shower head 204 is disposed at the upper portion of the processing chamber 201 to face the substrate support 202, and is used to introduce a ruthenium source gas into the processing chamber 201 in a shower pattern. The shower head 204 has therein a gas diffusion space 216, and a plurality of gas injection holes 217 communicating with the gas diffusion space 216 are formed in the bottom surface of the shower head 204.

The heating mechanism 205 is configured as a resistance heater disposed inside the substrate support 202. The heating mechanism 205 heats the substrate W on the substrate support 202 to a desired temperature by a power supplied from a heater power supply (not shown), thereby performing CVD film formation. The output of the heater power supply is controlled by a heater controller (not shown).

The source gas supply mechanism 300 sublimates a solid ruthenium source that is a low vapor pressure source, and supplies the generated source gas to the processing part 200 by a carrier gas. The source gas supply mechanism 300 has a source container 301, a heating mechanism 302, a CO gas supply source 303, a line group 304, a valve group 305, a pressure gauge 306, and a controller 307.

The source container 301 is detachably provided, and contains a solid ruthenium source 311. The ruthenium source is typically ruthenium carbonyl ($Ru_3(CO)_{12}$). The heating mechanism 302 is disposed around the source container 301, and heats the ruthenium source 311 in the source container 301 to about 80° C. to sublimate it. The CO gas supply source 303 supplies CO gas serving as a carrier gas and a replacement gas. $N_2$ gas is filled in an unused source container 301. When the source container 301 is heated in a state where $N_2$ gas is filled therein, the ruthenium source gas deteriorates due to thermal decomposition. Therefore, CO gas functions as a replacement gas for replacing $N_2$ gas in the source container 301.

The line group 304 has a first line 321, a second line 322, a third line 323, and a fourth line 324. The first line 321 extends from the CO gas supply source 303 to the source container 301 and is used to supply CO gas that is a carrier gas to the source container 301. The second line 322 extends from the source container 301 to the shower head 204 of the processing part 200, and is used to transfer the ruthenium source gas sublimated in the source container 301 to the processing chamber 201 together with CO gas as a carrier gas. The third line 323 is disposed between the first line 321 and the source gas supply line 322, and functions as a bypass line for bypassing CO gas from the first line 321 to the second line 322 without passing through the source container 301. The fourth line 324 branches from the second line 322 and reaches the exhaust line 214 of the processing part 200, and is used to perform pre-flow of the ruthenium source gas.

The first line 321 is provided with a mass flow controller (MFC) 325 as a flow rate controller. Further, a switching line 321a is disposed in parallel with a portion of the first line 321 near the source container 301. The switching line 321a is configured to branch from the portion of the first line 321 near the source container 301 and join the first line 321 again. The switching line 321a is configured to have a smaller conductance than that of the first line 321.

The valve group 305 includes valves 331, 332, and 333 disposed on the first line 321, a valve 334 disposed on the switching line 321a, valves 341 and 342 disposed on the second line 322, a valve 335 disposed on the third line 323, and a valve 343 disposed on the fourth line 324. The valves 331 and 332 are disposed on both sides of the mass flow controller (MFC) 325 of the first line 321. The valve 333 is disposed between the branching portion and the joining portion of the switching line 321a in the first line 321, and the valve 334 is disposed on the switching line 321a. The valve 341 is disposed on the portion of the second line 322 near the source container 301. The valve 342 is disposed on the downstream side than the portion of the second line 322 on the processing part 200 side that is branched to the fourth line 324. The valve 343 is disposed near the branching portion of the fourth line 324. Among the valve group 305, the valves 333, 334, 335, and 341 are disposed near the source container, and the valves 342 and 343 are disposed on the exhaust side.

The pressure gauge 306 is disposed on the second line 322 to measure a pressure in the second line 322. The pressure gauge 306 is, e.g., a capacitance manometer. By measuring the pressure in the second line 322 using the pressure gauge 306, it is determined whether or not the source container 301 has been replaced with CO gas.

Figure 2:
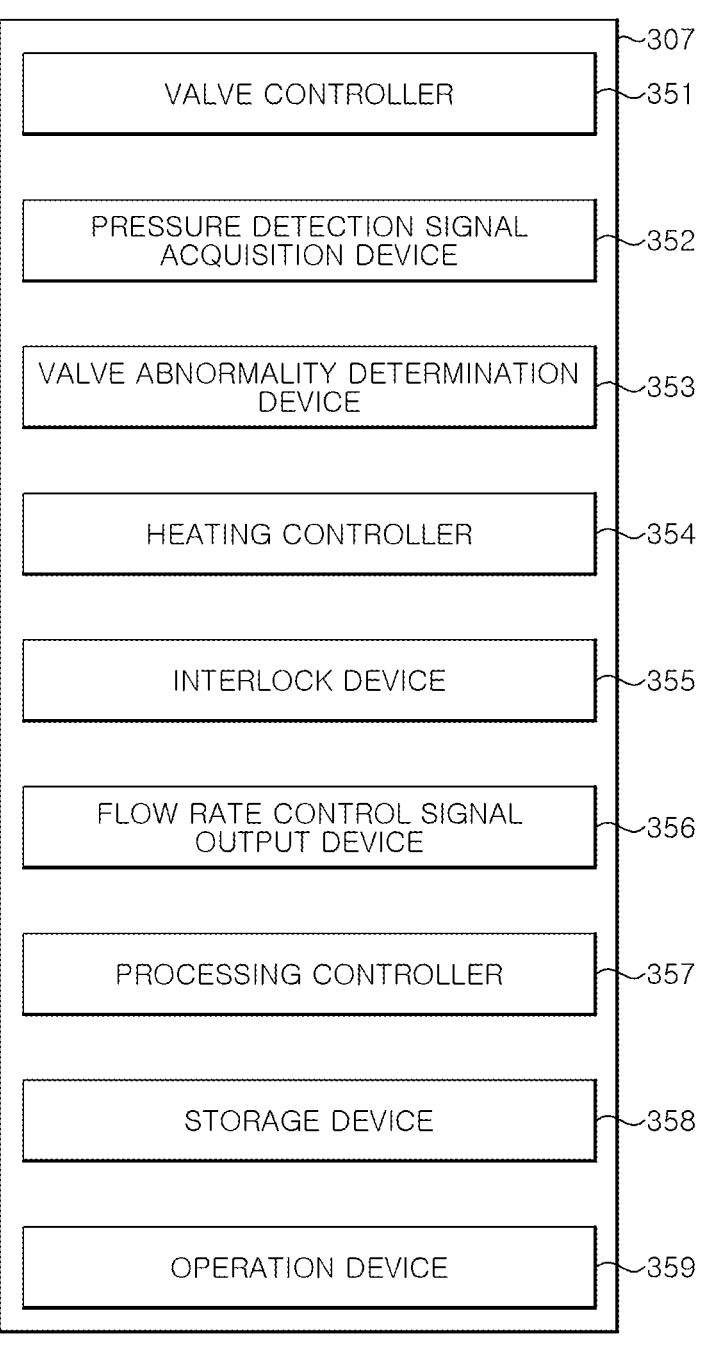
FIG. 2 is a block diagram showing a controller for controlling the source gas supply mechanism of the film forming system shown in FIG. 1.

The controller 307 controls operations of individual components of the source gas supply mechanism 300. The controller 307 controls the sequence of replacing $N_2$ gas filled in the source container 301 with CO gas, the detection of abnormality of the valves, the supply of the source gas, and the like. Specifically, as shown in FIG. 2, the controller 307 includes a valve controller 351, a pressure detection signal acquisition device 352, a valve abnormality determination device 353, a heating controller 354, an interlock device 355, a flow rate control signal output device 356, a processing controller 357, a storage device 358, and an operation device 359.

The valve controller 351 transmits an open command or a close command to each valve. The pressure detection signal acquisition device 352 acquires a pressure detection signal from the pressure gauge 306. The valve abnormality determination device 353 determines whether or not each valve is abnormal based on the signal acquired by the pressure detection signal acquisition device 352. The heating controller 354 controls heating of the source container 301 by the heating mechanism 302. The interlock device 355 prevents the source container 301 from being heated when the sequence of purging and replacing $N_2$ gas filled in the source container 301 with CO gas has not been completed. The flow rate control signal output device 356 controls a flow rate set value of the mass flow controller (MFC). The processing controller 357 controls a sequence of replacing $N_2$ gas in the source container 301 with CO gas, a valve abnormality detection sequence, gas supply during film formation, and the like. The storage device 358 stores process parameters for control, or process recipes for controlling the gas replacement sequence, the valve abnormality detection sequence, the gas supply during film formation, and the like. The operation device 359 sets parameters required for control.

The source gas supply mechanism 300 further includes an $N_2$ gas supply source 361 for supplying $N_2$ gas as a purge gas, an $N_2$ gas supply line 362, and valves 363 and 364 disposed on the $N_2$ gas supply line 362. The $N_2$ gas supply line 362 is connected between the valve 331 and the mass flow controller 325 of the first line 321 and on the downstream side of the valve 332. In the case of replacing the source container 301, the supply of CO gas is stopped, and $N_2$ gas is supplied from the $N_2$ gas supply source 361 to purge the inside of the line or the inside of the source container 301.

<Source Gas Supply Method>

Figure 3:
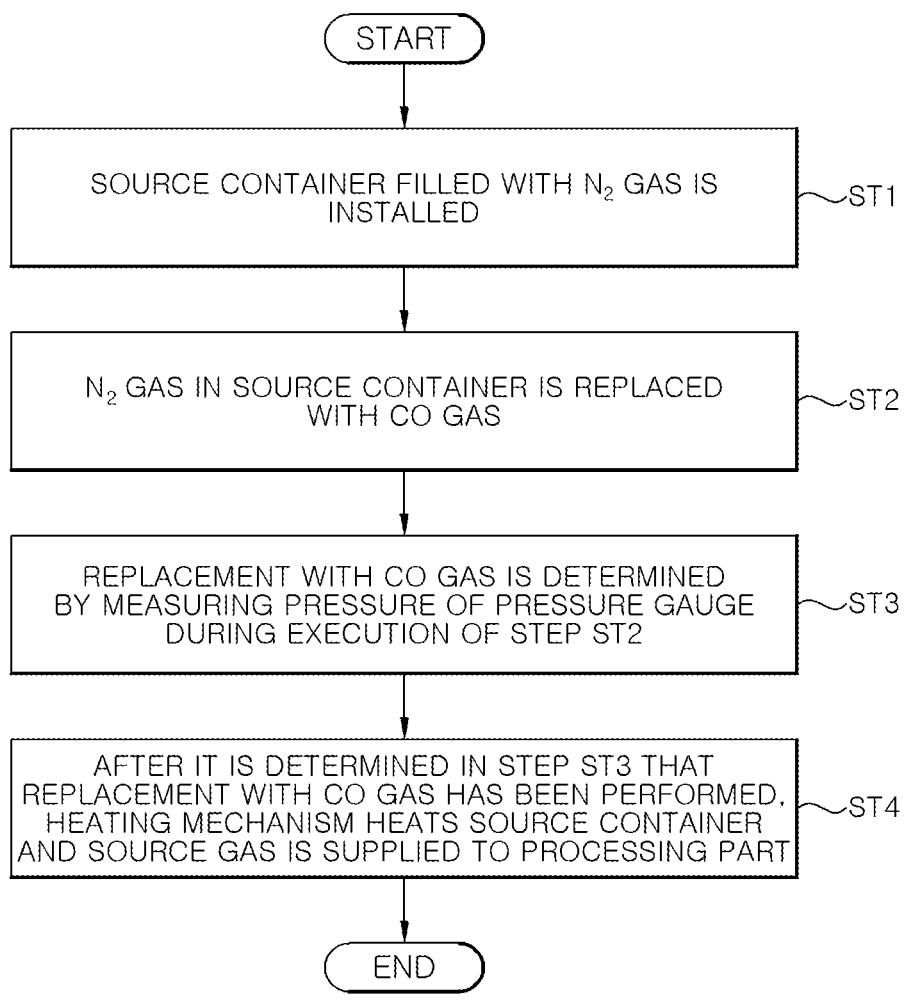
FIG. 3 is a flowchart for explaining a source gas supply method in the source gas supply mechanism.

Next, a source gas supply method will be described. FIG. 3 is a flowchart for explaining the source gas supply method in the source gas supply mechanism 300. First, the source container 301 filled with $N_2$ gas is installed (step ST1). Next, $N_2$ gas in the source container 301 is replaced with CO gas (step ST2). It is determined whether or not $N_2$ gas is replaced with CO gas by measuring a pressure of the pressure gauge 306 during the execution of step ST2 (step ST3). When it is determined in step ST3 that $N_2$ gas is replaced with CO gas, the heating mechanism 302 heats the source container 301 and the source gas is supplied to the processing part 200 (step ST4). A ruthenium film is formed on the substrate W by supplying the source gas to the processing part 200 in step ST4.

In the film forming system 100 for forming a ruthenium film, the source container 301 is detachably provided and periodically replaced as the source is consumed. If a new source container 301 filled with $N_2$ gas is installed in step ST1 and the heating for film formation is performed in that state, the ruthenium source deteriorates by $N_2$ gas, and thus cannot be used. Therefore, in step ST2, $N_2$ gas in the source container 301 is replaced with CO gas. Step ST2 is performed by operating a valve.

In step ST2, for example, first, an $N_2$ gas discharge sequence for discharging $N_2$ gas in the source container 301 is performed and, then, $N_2$ gas remaining in the source container 301 is purged and replaced with CO gas. In this example, it is determined whether or not $N_2$ gas is replaced with CO gas by measuring the pressure of the pressure gauge 306 in step ST3 while $N_2$ gas is being purged and replaced with CO gas.

The valves 333, 334, 335, and 341 disposed near the source container are connected to the source container 301. In the case of replacing the source container 301, air tubes for driving the valves are separated. In the case of installing a new source container 301, the air tubes for driving the valves are attached. Therefore, in step ST2, when N$_2$ gas in the source container 301 is replaced with CO gas, the connection failure of the air tubes is likely to occur, which may lead to malfunction of the valves. Accordingly, the replacement of N$_2$ gas in the source container 301 with CO gas may fail. Further, the replacement of N$_2$ gas in the source container 301 with CO gas fails due to the malfunction of the valves, insufficient CO gas supply, leakage in a gas path, or the like. If the replacement with CO gas fails, N$_2$ gas in the source container 301 is not be replaced with CO gas, and the ruthenium source deteriorates during the gas supply.

If the malfunction of the valves, the insufficient CO gas supply, and the leakage in the gas path occur, the pressure in the line does not increase. Hence, in the present embodiment, it is determined whether or not N$_2$ gas in the source container 301 has been replaced with CO gas by measuring a pressure in the line using the pressure gauge 306. This is simpler compared to the case of adding a sensor to the valve because it is sufficient to measure a pressure in the line.

Hereinafter, specific examples of steps ST2 and ST3 will be described.

Figures 4A, 4B, 4C, 4D:
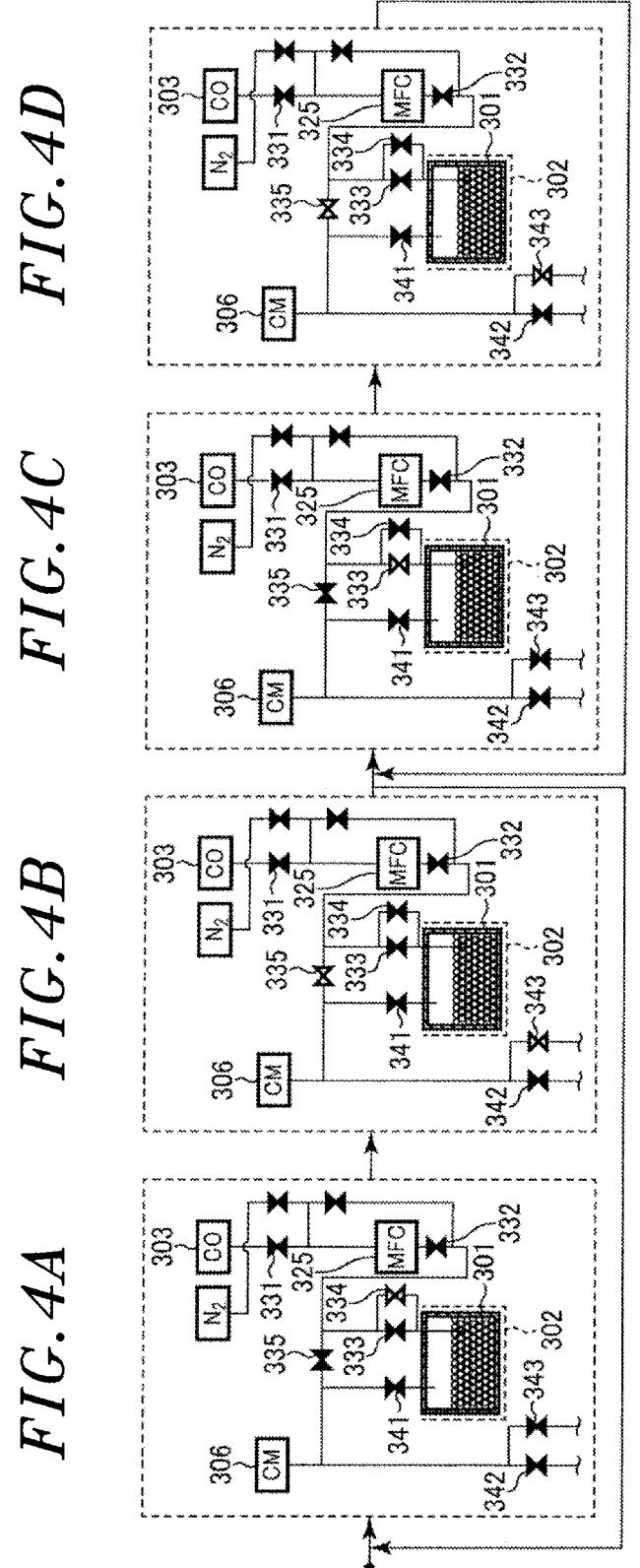
FIGS. 4A to 4D explain an N2 gas exhaust sequence in step ST2 of the source gas supply method shown in FIG. 3.

In step ST2, first, as shown in FIGS. 4A to 4D, an N$_2$ gas exhaust sequence for exhausting N$_2$ gas in the source container 301 is performed. In FIGS. 4A to 4D, closed valves are shown in black, and open valves are shown in white (the same in FIGS. 5A to 5C and 6A to 6D). In the N$_2$ gas exhaust sequence, first, in a state where all the valves are closed, slow exhaust in which an operation of opening the valve 334 of the switching line 321$a$ having a small conductance as shown in FIG. 4A and an operation of closing the valve 334 and opening the valves 335 and 343 as shown in FIG. 4B are repeated multiple times (e.g., 100 times) is performed. Next, in a state where all the valves are closed, fast exhaust in which an operation of opening the valve 333 as shown in FIG. 4C and an operation of closing the valve 333 and opening the valves 335 and 343 as shown in FIG. 4D are repeated multiple times (e.g., 50 times) is performed. Accordingly, most of N$_2$ gas in the source container 301 is discharged.

Next, in the remaining part of the step ST2, the valves operate to perform the purging and replacement using CO gas to squeeze out a small amount of N$_2$ gas remaining in the source container 301 or in the line. At the same time, it is determined whether or not N$_2$ gas in the source container 301 has been replaced with CO gas.

The purging and replacement using CO gas and the determination of whether or not N$_2$ gas has been replaced with CO gas can be performed by executing the valve abnormality detection sequence shown in FIGS. 5A to 5C, for example, after the completion of the above-described N$_2$ gas discharge sequence. In the valve abnormality detection sequence, it is determined whether or not the valves around the source container 301 are abnormal based on the measured value of the pressure gauge 306. In this process, N$_2$ gas remaining in the source container 301 or the like is purged and replaced with CO gas.

As described above, when the connection failure occurs in the driving air tubes, for example, the valves are not opened even if the controller 307 outputs a valve open command, and the replacement with CO gas is not be performed. Therefore, in this example, as atypical example of the determination of whether or not the replacement with CO gas in step ST3 has been performed, it is determined that the replacement with CO gas has been performed when it is determined that there is no opening/closing abnormality of the valves around the source container 301 by executing the valve abnormality detection sequence.

The valve abnormality detection sequence is performed as shown in FIGS. 5A to 5C. First, in a state where all the valves are closed, the valve 331 is opened, and the flow rate is controlled by the mass flow controller (MFC) 325. Further, the valves 332, 334, 341 and 343 are sequentially opened as in the state shown in FIG. 5A. In this state, the pressure in the second line 322 is measured by the pressure gauge 306. At this time, if the valves 334 and 341 are not opened due to the connection failure of the air tubes or the like, the gas does not flow and the pressure in the line does not increase. Therefore, if the pressure measured by the pressure gauge 306 is lower than the set value, the valve abnormality determination device 353 determines that there are opening/closing abnormalities of the valves. On the contrary, if the pressure measured by the pressure gauge 306 is greater than or equal to the set value, it is determined that the valves are normal. The set value at this time is 0.04 Torr, for example.

Next, the pre-flow state shown in FIG. 5B is obtained by closing the valve 334 and opening the valve 333. In this state, the pressure in the second line 322 is measured by the pressure gauge 306. Also in this case, similarly, if the measured pressure is lower than the set value, the valve abnormality determination device 353 determines that there is opening/closing abnormality of the valve 333. On the contrary, if the measured pressure is greater than or equal to the set value, it is determined that the valve 333 is normal. In the normal case, the pre-flow is performed normally, and N$_2$ gas remaining in the source container 301 or the like is squeezed out by CO gas, thereby replacing N$_2$ gas in the source container 301 or the like with CO gas.

Next, a pre-bypass state shown in FIG. 5C is obtained by closing the valve 333 and opening the valve 335 of the third line 323. In this state, the pressure in the second line 322 is measured by the pressure gauge 306. Also in this case, similarly, if the measured pressure is lower than the set value, the valve abnormality determination device 353 determines that the valve 335 is abnormal. On the contrary, if the measured pressure is greater than or equal to the set value, it is determined that the valve 335 is normal.

If it is determined in the valve abnormality detection sequence that there is no opening/closing abnormality of the valve and N$_2$ gas in the source container 301 is replaced with CO gas, step ST4 is executed. In other words, the heating mechanism 302 heats the source container 301 to vaporize (sublimate) the ruthenium source, and the source gas is supplied to the processing part 200. Accordingly, a ruthenium film is formed on the substrate W in the processing chamber 201 of the processing part 200.

At this time, it is preferable that the interlock device 355 of the controller 307 applies interlock to prevent the source container 301 from being heated until the sequence of replacing N$_2$ gas filled in the source container 301 with CO gas is completed. In this case, when it is determined that there is no valve abnormality, a CO gas replacement completion flag is set to release the interlock so that the source container 301 can be heated. Accordingly, the heating can be performed after it is confirmed that the replacement with CO gas has been completed, and the deterioration of the ruthenium source can be more reliably prevented. The flag is stored in storage device 358. When the pressure in the processing vessel 201 of the processing part 200 becomes an atmospheric pressure, the flag is cleared and the interlock device 355 sets interlock again. This is because the source container 301 may be replaced when the pressure in the processing chamber 201 becomes an atmospheric pressure, and the source container 301 may be filled with $N_2$ gas.

The valve abnormality detection sequence executed using the pressure gauge 306 can be applied to the case of detecting the abnormality of the valves 342 and 343 that are the exhaust-side valves disposed on the processing part side as well as the case of confirming the completion of the replacement with CO gas by determining the abnormality of the valves 333, 334, 335, and 341 around the source container 301.

FIGS. 6A to 6D show a specific example of the abnormality detection sequence. First, the abnormality detection of the valve 343 is performed. In a state where all the valves are closed, as shown in FIG. 6A, the valve 331 is opened, and the flow rate is controlled by the mass flow controller (MFC) 325. Further, the valves 332, 335, and 343 are opened to perform pre-bypass flow control. Next, as shown in FIG. 6B, the valve 331 is closed to perform pre-vacuum control in which the line is evacuated. At this time, if the valve 343 is not opened in spite of the open command from the controller 307, the pressure detected by the pressure gauge 306 does not decrease, which makes it possible to detect the abnormality of the valve 343. Specifically, if the pressure measured by the pressure gauge 306 is higher than the set value, it is determined that the valve 343 is abnormal. The set value at this time is 0.01 Torr, for example.

Next, the abnormality detection of the valve 342 is performed. In a state where all the valves closed, the same pre-bypass flow control as that shown in FIG. 6A is performed (see FIG. 6C). Next, as shown in FIG. 6D, in a state where the valve 331 is closed, the valve 342 is opened, and the valve 343 is closed, vacuum flow control is performed. At this time, if the valve 342 is not opened, the pressure detected by the pressure gauge 306 does not decrease, which makes it possible to detect abnormality of the valve 342.

Other Applications

While the embodiments have been described, the embodiments of the present disclosure are illustrative in all respects and are not restrictive. The above-described embodiments may be omitted, replaced, or changed in various forms without departing from the scope of the appended claims and the gist thereof.

For example, the above embodiment has described an example in which the ruthenium source is used as the film forming source, $N_2$ gas is used as a filling gas filled in the source container 301, and CO gas is used as the replacement gas. However, the present disclosure is not limited to such combination as long as the filling gas is a gas that deteriorates the film forming source by heating and the deterioration of the film forming source is prevented by replacing the filling gas with the replacement gas. Further, although the above embodiment has described an example in which CO gas as a carrier gas is used as the replacement gas, the replacement gas may be different from the carrier gas.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

8

What is claimed is:

1. A source gas supply method for supplying a source gas to a processing part through a line by a carrier gas, the source gas being generated by vaporizing a film forming source by heating a source container in which the film forming source is stored and a filling gas is filled, the method comprising:
   supplying a replacement gas from a replacement gas supply source toward the source container for replacing the filling gas in the source container, wherein the replacement gas does not deteriorate the source gas;
   determining an extent of replacement with the replacement gas by measuring a pressure in the line using a pressure gauge; and
   heating the source container and supplying the source gas when it is determined that the replacement with the replacement gas has been performed,
   wherein in said determining the extent of the replacement with the replacement gas, it is determined that the replacement has failed when the pressure measured by the pressure gauge is lower than a set value.

2. The source gas supply method of claim 1, wherein the replacement gas is supplied as the carrier gas.

3. A source gas supply method for supplying a source gas to a processing part through a line by a carrier gas, the source gas being generated by vaporizing a film forming source by heating a source container in which the film forming source is stored and a filling gas is filled, the method comprising:
   supplying a replacement gas from a replacement gas supply source toward the source container for replacing the filling gas in the source container, wherein the replacement gas does not deteriorate the source gas;
   determining an extent of replacement with the replacement gas by measuring a pressure in the line using a pressure gauge; and
   heating the source container and supplying the source gas when it is determined that the replacement with the replacement gas has been performed,
   wherein the extent of the replacement with the replacement gas is determined by determining abnormality of a valve disposed in the line to be close to the source container by measuring a pressure in the line using the pressure gauge, and
   wherein when an open command is outputted to the valve, if the pressure in the line is lower than a set value, it is determined that the valve is abnormal.

4. The source gas supply method of claim 3, wherein said supplying a replacement gas for replacing the filling gas includes:
   discharging the filling gas from the source container; and
   purging and replacing the filling gas remaining in the source container with the replacement gas,
   wherein said purging and replacing is performed at the time of determining abnormality of the valve.

5. A source gas supply method for supplying a source gas to a processing part through a line by a carrier gas, the source gas being generated by vaporizing a film forming source by heating a source container in which the film forming source is stored and a filling gas is filled, the method comprising:
   supplying a replacement gas from a replacement gas supply source toward the source container for replacing the filling gas in the source container, wherein the replacement gas does not deteriorate the source gas;
   determining an extent of replacement with the replacement gas by measuring a pressure in the line using a pressure gauge; and heating the source container and supplying the source gas when it is determined that the replacement with the replacement gas has been performed, wherein the extent of the replacement with the replacement gas is determined by determining abnormality of a valve disposed in the line to be close to the source container by measuring a pressure in the line using the pressure gauge, and wherein the line is provided with an exhaust-side valve disposed on the processing part side that is an exhaust side, and when an open command is outputted to the exhaust-side valve, if a pressure measured by the pressure gauge is higher than a set value, it is determined that the exhaust-side valve is abnormal.

6. The source gas supply method of claim 1, wherein in said determining the extent of the replacement with the replacement gas, it is determined that the replacement has failed when the pressure measured by the pressure gauge is lower than the set value due to insufficient supply of the replacement gas or leakage in the line.

7. A source gas supply method for supplying a source gas to a processing part through a line by a carrier gas, the source gas being generated by vaporizing a film forming source by heating a source container in which the film forming source is stored and a filling gas is filled, the method comprising:

supplying a replacement gas from a replacement gas supply source toward the source container for replacing the filling gas in the source container, wherein the replacement gas does not deteriorate the source gas;

determining an extent of replacement with the replacement gas by measuring a pressure in the line using a pressure gauge; and heating the source container and supplying the source gas when it is determined that the replacement with the replacement gas has been performed, wherein the film forming source is a ruthenium source, the filling gas is $N_2$ gas, and the replacement gas is CO gas.

8. The source gas supply method of claim 7, wherein the ruthenium source is ruthenium carbonyl.

9. The source gas supply method of claim 1, wherein an interlock is set to prevent the source container from being heated when said supplying a replacement gas for replacing the filling gas has not been completed.

10. The source gas supply method of claim 9, wherein the interlock is released when it is determined that the replacement with the replacement gas has been performed.

11. A source gas supply mechanism for supplying a source gas to a processing part by a carrier gas, the source gas being generated by vaporizing a film forming source, comprising:

a source container in which the film forming source is stored and a filling gas is filled;

a heating mechanism configured to heat the source container to vaporize the film forming source;

a replacement gas supply source configured to supply, as the carrier gas, a replacement gas that does not deteriorate the source gas into the source container;

a line disposed between the replacement gas supply source and the source container and between the source container and the processing part;

a valve disposed in the line to be adjacent to the source container;

a pressure gauge disposed on the line; and a controller, wherein the controller executes:

supplying the replacement gas from the replacement gas supply source toward the source container for replacing the filling gas in the source container, determining abnormality of the valve by measuring a pressure of the line using the pressure gauge at the time of outputting an open command to the valve in said replacing and, and then determining an extent of replacement with the replacement gas based on the result of the abnormality determination; and heating the source container using the heating mechanism and supplying the source gas using the source gas supply mechanism when it is determined that the replacement with the replacement gas has been performed, wherein the controller determines that the valve is abnormal if the pressure in the line is lower than a set value when the open command is outputted to the valve.

12. A source gas supply mechanism for supplying a source gas to a processing part by a carrier gas, the source gas being generated by vaporizing a film forming source, comprising:

a source container in which the film forming source is stored and a filling gas is filled;

a heating mechanism configured to heat the source container to vaporize the film forming source;

a replacement gas supply source configured to supply, as the carrier gas, a replacement gas that does not deteriorate the source gas into the source container;

a line disposed between the replacement gas supply source and the source container and between the source container and the processing part;

a valve disposed in the line to be adjacent to the source container;

a pressure gauge disposed on the line; and a controller, wherein the controller executes:

supplying the replacement gas from the replacement gas supply source toward the source container for replacing the filling gas in the source container, determining abnormality of the valve by measuring a pressure of the line using the pressure gauge at the time of outputting an open command to the valve in said replacing and, and then determining an extent of replacement with the replacement gas based on the result of the abnormality determination; and heating the source container using the heating mechanism and supplying the source gas using the source gas supply mechanism when it is determined that the replacement with the replacement gas has been performed, wherein the source gas supply mechanism further comprises:

an exhaust-side valve disposed on the processing part side that is an exhaust side of the line, wherein the controller determines that the exhaust-side valve is abnormal if the pressure measured by the pressure gauge is higher than the set value when an open command is outputted to the exhaust-side valve.

13. A source gas supply mechanism for supplying a source gas to a processing part by a carrier gas, the source gas being generated by vaporizing a film forming source, comprising:

a source container in which the film forming source is stored and a filling gas is filled;

a heating mechanism configured to heat the source container to vaporize the film forming source;

a replacement gas supply source configured to supply, as the carrier gas, a replacement gas that does not deteriorate the source gas into the source container;

a line disposed between the replacement gas supply source and the source container and between the source container and the processing part;

a valve disposed in the line to be adjacent to the source container;

a pressure gauge disposed on the line; and a controller, wherein the controller executes:

supplying the replacement gas from the replacement gas supply source toward the source container for replacing the filling gas in the source container, determining abnormality of the valve by measuring a pressure of the line using the pressure gauge at the time of outputting an open command to the valve in said replacing and, and then determining an extent of replacement with the replacement gas based on the result of the abnormality determination; and heating the source container using the heating mechanism and supplying the source gas using the source gas supply mechanism when it is determined that the replacement with the replacement gas has been performed, wherein the film forming source is a ruthenium source, the filling gas is $N_2$ gas, and the replacement gas is CO gas.

14. The source gas supply mechanism of claim 13, wherein the ruthenium source is ruthenium carbonyl.

15. The source gas supply mechanism of claim 11, wherein the controller has an interlock device, and the interlock device sets interlock to prevent the source container from being heated when said replacing with the replacement gas has not been completed.

16. The source gas supply mechanism of claim 15, wherein the interlock device releases the interlock when it is determined that the replacement with the replacement gas has been performed.

17. A film forming system comprising:

a processing part configured to perform film formation on a substrate; and a source gas supply mechanism configured to supply a source gas to the processing part by a carrier gas, the source gas being generated by vaporizing a film forming source, wherein the source gas supply mechanism includes:

a source container in which a film forming source is stored and a filling gas is filled;

a heating mechanism configured to heat the source container to vaporize the film forming source;

a replacement gas supply source configured to supply, as the carrier gas, a replacement gas that does not deteriorate the source gas;

a line disposed between the replacement gas supply source and the source container and between the source container and the processing part;

a valve disposed in the line to be close to the source container;

a pressure gauge disposed in the line; and a controller, wherein the controller executes:

supplying the replacement gas from the replacement gas supply source toward the source container for replacing the filling gas in the source container;

determining abnormality of the valve by measuring a pressure of the line using the pressure gauge at the time of outputting an open command to the valve in said replacing and, and then determining an extent of replacement with the replacement gas based on the result of the abnormality determination; and heating the source container using the heating mechanism and supplying the source gas using the source gas supply mechanism when it is determined that the replacement with the replacement gas has been performed, wherein the controller determines that the valve is abnormal if the pressure in the line is lower than a set value when the open command is outputted to the valve.

* * * * *